(12) United States Patent
Qin et al.

(10) Patent No.: US 7,345,300 B2
(45) Date of Patent: Mar. 18, 2008

(54) PHOSPHORESCENT LIGHT-EMITTING COMPONENT COMPRISING ORGANIC LAYERS

(76) Inventors: Dashan Qin, Institute for Microstructural Sciences, M50-263, 1200 Montreal Road, Ontario (CA) K1A 0R6; Jan Blochwitz-Nimoth, Hospitalstrasse 3, Dresden (DE) 01069; Xiang Zhou, State Key Lab of Optoelectronic Materials and Tech, Zhongshan (Sun-Yat-Sen) University, 135 Xingang XiLu, Guangzhou (CN) 510275; Martin Pfeiffer, Alttrachau 4, Dresden (DE) 01339

( * ) Notice: Subject to any disclaimer, the term of this patent is extended or adjusted under 35 U.S.C. 154(b) by 126 days.

(21) Appl. No.: 10/515,935

(22) PCT Filed: May 22, 2003

(86) PCT No.: PCT/DE03/01659

§ 371 (c)(1),
(2), (4) Date: Mar. 21, 2005

(87) PCT Pub. No.: WO03/100880

PCT Pub. Date: Dec. 4, 2003

(65) Prior Publication Data

US 2006/0231843 A1    Oct. 19, 2006

(30) Foreign Application Priority Data

May 24, 2002    (DE)    ............... 102 24 021

(51) Int. Cl.
*H01L 29/08* (2006.01)
(52) U.S. Cl. ............... 257/40; 257/96; 257/103; 313/504

(58) Field of Classification Search ............... 257/103, 257/40, 96; 313/504
See application file for complete search history.

(56) References Cited

U.S. PATENT DOCUMENTS 4,356,429 A    10/1982    Tang (Continued)

FOREIGN PATENT DOCUMENTS

DE    10058578 A1    11/2000

(Continued)

OTHER PUBLICATIONS

Adachi, Chihaya, et al., "Efficient electrophosphorescence using a doped ambipolar conductive molecular organic thin film," *Organic Electronics 2*, (2001), pp. 37-43.

(Continued)

*Primary Examiner*—Sara Crane
(74) *Attorney, Agent, or Firm*—Sutherland Asbill & Brennan LLP

(57) ABSTRACT

The invention relates to a light emitting component with organic layers and emission of triplet exciton states (phosphorescent light) with increased efficiency, having a layer sequence with a hole injecting contact (anode), one or more hole injecting and transporting layers, a system of layers in the light emission zone, one or more electron transport and injection layers and an electron injecting contact (cathode), characterized in that the light emitting zone comprises a series of heterojunctions with the materials A and B (ABAB . . . ) that form interfaces of the type "staggered type II", one material (A), having hole transporting or bipolar transport properties and the other material (B) having electron transporting or bi-polar transport properties, and at least one of the two materials A or B being mixed with a triplet emitter dopant that is able to efficiently convert its triplet exciton energy into light.

17 Claims, 6 Drawing Sheets

U.S. PATENT DOCUMENTS

| | | | |
|---|---|---|---|
| 4,769,292 | A | 9/1988 | Tang et al. |
| 5,093,698 | A | 3/1992 | Egusa |
| 5,703,436 | A | 12/1997 | Forrest et al. |
| 5,757,026 | A | 5/1998 | Forrest et al. |
| 5,969,474 | A | 10/1999 | Arai |
| 6,303,238 | B1 | 10/2001 | Thompson et al. |
| 6,310,360 | B1 | 10/2001 | Forrest et al. |
| 6,573,651 | B2 * | 6/2003 | Adachi et al. ............. 313/504 |
| 6,645,645 | B1 | 11/2003 | Burroughes et al. |
| 6,897,473 | B1 | 5/2005 | Burroughes et al. |
| 6,900,588 | B2 * | 5/2005 | Adachi et al. ............. 313/504 |
| 7,001,536 | B2 * | 2/2006 | Thompson et al. .... 252/301.16 |
| 2003/0146443 | A1 | 8/2003 | Atsushi et al. |

FOREIGN PATENT DOCUMENTS

| | | |
|---|---|---|
| DE | 10224021 A1 | 5/2002 |
| WO | WO99/48160 | 9/1999 |
| WO | WO 01/08230 A | 2/2001 |
| WO | WO 01/93642 | 12/2001 |
| WO | WO 02/41414 A | 5/2002 |
| WO | WO 03/100880 A3 | 12/2003 |

OTHER PUBLICATIONS

Adachi, Chihaya, et al., "Nearly 100% internal phosphorescence efficiency in an organic light emitting device," *Journal of Applied Physics*, (2001), vol. 90:10, pp. 5048-5051.

Adachi, Chihaya, et al., "High-efficiency organic electrosphosphrescent devices with tris(2-phenylpyridine)iridium doped into electron-transporting materials," *Applied Physics Letters*, (2000), vol. 77:6, pp. 904-906.

Ammermann, Dirk, et al., "Photonic Devices Based on Crystalline Organic Semiconductors for Optoelectronic Integrated Circuits," *Jpn. J. Appl. Phys. Pt. 1*, (1995), vol. 34, pp. 1293-1297.

Baldo, M.A., et al., "High-efficiency fluorescent organic light-emitting devices using a phosphorescent sensitizer," *Nature*, (2000), vol. 403, pp. 750-753.

Baldo, M.A., et al., "Transient analysis of organic electrophosphorescence: I. Transient analysis of triplet energy transfer," *Physical Review B*, (2000), vol. 62:16, pp. 10958-10966.

Baldo, M.A., et al., "Transient analysis of organic electrophosphorescence. II. Transient analysis of triplet-triplet annihilation," *Physical Review B*, (2000), vol. 62:16, pp. 10967-10977.

Baldo, M. A., et al., "Very high-efficiency green organic light-emitting devices based on electrophosphorescence," *Applied Physics Letters*, (1999), vol. 75:1, pp. 4-6.

Bastard, G., "Wave mechanics applied to semiconductor heterostructures," *The Editions of Physique*, (1988) pp. 64-67.

Blochwitz, J., et al., "Non-polymeric OLEDs with a doped amorphous hole transport layer and operating voltages down to 3.2 V to achieve 100 cd/m$^2$," *Synthetic Met.als*, (2002),vol. 127, pp. 169-173.

D'andrade, Brian W., et al., "High-efficiency yellow double-doped organic light-emitting devices based on phosphorsensitized fluorescence," *Applied Physics Letters*, (2001), vol. 79:7, pp. 1045-1047.

Gu, G., et al., "Transparent organic light emitting devices," *Applied Physics Letters*, (1996), vol. 68:19, pp. 2606-2608.

Hu, Wenping, et al., "Efficient red electroluminescence from devices having multilayers of a europium complex," *Applied Physics Letters*, (2000), vol. 77:26, pp. 4271-4273.

Huang, Jingsong, et al., "Influence of the thickness and doping of the emission layer on the performance of organic light-emitting diodes with PiN structure," *Journal of Applied Physics*, (2003), vol. 93:2, pp. 838-844.

Huang, Jingsong, et al., "Low Operating Voltage and High Efficiency Organic Multilayer Electroluminescent Devices with p-type Doped Hole Injection Layer," *Jpn. J. Appl. Phys.*, (2001), vol. 40, pp. 6630-6633.

Huang, Jingsong, et al., "Effect of well number on organic multiple-quantum-well electroluminescent device characteristics," *Applied Physics Letters*, (1998), vol. 73:23, pp. 3348-3350.

Ikai, Masamichi, et al., "Highly efficient phosphorescence from organic light-emitting devices with an exciton-block layer," *Applied Physics Letters*, (2001), vol. 79:2, pp. 156-158.

Mattoussi, Hedi, et al., "Photoluminescence quantum yield of pure and molecularly doped organic solid films," *Journal of Applied Physics*, (1999), vol. 86:5, pp. 2642-.

Mori, T., et al., "Electroluminescence of organic light emitting diodes with alternately deposited dye-doped aluminium quinoline and diamine derivative," *Journal of Physics D—Applied Physics*, (1999), vol. 32:11, pp. 1198-1203.

Ohmori, Yutaka, et al., "Fabrication and characteristics of 8-hydroxyquinoline aluminum/aromatic diamine organic multiple quantum well and its use for electroluminescent diode," *Applied Physics Letters*, (1993), vol. 62:65, pp. 3250-3252.

Ohmori, Yutaka, et al., "Observation of spectral narrowing and emission energy shift in organic electroluminescent diode utilizing 8-hydroxyquinoline aluminum/aromatic diamine multilayer structure," *Applied Physics Letters*, (1993), vol. 63:14, pp. 1871-1873.

Pfeiffer, Martin, et al., "Electrophosphorescentp-i-n Organic Light-Emitting Devices for Very-High-Efficiency Flat-Panel Displays," *Advanced Materials*, (2002), vol. 14:22, pp. 1633-1636.

Pope, et al., "Single positive or negative carriers in organic crystals," *Electronic Processes in Organic Crystals and Polymer*, Oxford Science Publications, Oxford University Press, (1999), pp. 202-207.

Sakamoto, Gosuke, et al., "Significant improvement of device durability in organic light-emitting diodes by doping both hole transport and emitter layers with rubrene molecules," *Applied Physics Letters*, (1999), vol. 75:6, pp. 766-768.

Tang, C. W., et al., "Electroluminescence of doped organic thin films," *Journal of Applied Physics*, (1989), vol. 65:9, pp. 3610-3616.

Tang, C. W., et al., "Organic electroluminescent diodes," *Applied Physics Letters*, (1987), vol. 51:12, pp. 913-915.

Tsutsui, Tetsuo, et al., "High Quantum Efficiency in Organic Light-Emitting Devices with Iridium-Complex as a Triplet Emissive Center," *Jpn. Journal of Applied Physics, part 2 Letters*, (1999), vol. 38:12B, pp. L1502-L1504.

* cited by examiner

LUMO

HOMO

TYPE I staggered TYPE II

PHOSPHORESCENT LIGHT-EMITTING COMPONENT COMPRISING ORGANIC LAYERS

CROSS-REFERENCE TO RELATED APPLICATIONS

This is a submission pursuant to 35 U.S.C. 154(d)(4) to enter the national stage under 35 U.S.C. 371 for PCT/DE2003/01659, filed May 22, 2003. Priority is claimed under 35 U.S.C. 119(a) and 35 U.S.C. 365(b) to German Patent Application No. 102 24 021.3, filed May 24, 2002.

The invention relates to a phosphorescent light emitting component with organic layers, in particular an organic light emitting diode (OLED) with increased current and quantum efficiency as a result of a novel structure of the emission zone according to the preambles of claims 1 and 2.

Since the demonstration of low operating voltages by Tang et al. 1987 (C. W. Tang et al. Appl. Phys. Lett. 51 (1987) 913), organic light emitting diodes have been promising candidates for realizing large area displays. They comprise a sequence of thin (typically 1 nm to 1 µm) layers made of organic materials which are preferably vapor deposited in vacuo (small molecule OLEDs) or applied from the solution e.g. by spin-on (polymeric OLEDs=PLEDs). After electrical contact connection by metal layers, organic thin films form diverse electronic or optoelectronic components, such as e.g. diodes, light emitting diodes, photodiodes and transistors, whose properties compete with those of the established components based on inorganic layers. The contacts of light emitting components are typically a transparent contact (e.g. indium tin oxide—ITO as anode) and a metallic contact with a low work function as cathode. Further OLEDs are semitransparent (thin metal contact—ITO structure) and others are fully transparent, (both contacts ITO). In order that light can be emitted from the active zone in the component (the emission zone or the emission layer or layer sequence) charge carriers have to be injected into the component and transported within the organic layers. By means of an applied voltage, holes are injected from the anode into an organic material with better hole conductivity (hole transport material) and electrons are injected from the cathode into an electron conducting material. The charge carriers meet in the emission zone, where they recombine and form excitons. The latter decay later accompanied by light emission or release of their energy to the molecules.

The advantages of such an LED based on organic molecules compared with the inorganic LEDs that have been known for a long time are the possibilities of applying organic materials to large, potentially flexible areas. Very large displays can be produced as a result. Moreover, the organic materials are relatively inexpensive in terms of their production and the production of the organic layers. Since they have a low refractive index, moreover, the light generated can be coupled out in a simple manner (with high efficiency).

The normal structure of an OLED contains some or all of the following organic layers (cf. FIG. 1):
1. Substrate.
2. Bottom electrode, e.g. hole injecting (anode), typically transparent,
3. Hole injecting layer,
4. Hole transporting layer (HTL),
4a. Possibly blocking layer, hole side,
5 Light emitting layer (EL),
6a. Possibly blocking layer, electron side,
6. Electron transport layer (ETL),
7. Electron injecting layer,
8. Top electrode, usually a metal with a low work function, electron injecting (cathode),
9. Encapsulation in order to preclude ambient influences (air, water).

This is the most general case; usually some layers are omitted (apart from 2., 5. and 8.), or else one layer combines a plurality of properties in itself. In the components described above, the light leaves the OLED through the transparent base electrode. Other structures have been demonstrated in which the layer structure is inverted (anode at the top, light emission through cathode and substrate) (G. Gu, V. Bulovic, P. E. Burrows, S. R. Forrest, Appl. Phys. Lett., 68, 2606 (1996), U.S. Pat. No. 5,703,436 (S. R. Forrest et al.), filed on Mar. 6, 1996; U.S. Pat. No. 5,757,026 (S. R. Forrest et al.), filed on Apr. 15, 1996; U.S. Pat. No. 5,969,474 (M. Arai) filed on Oct. 24, 1997) or through anode and cathode.

As in the case of Egusa et al. (U.S. Pat. No. 5,093,698, filed on Feb. 12, 1991) and Pfeiffer et al. (Patent Application DE 100 58 578.7, filed on Nov. 25, 2000), the charge transport layers (3 and 4, and 6 and 7) may be doped in order to increase their conductivity. In order that the current and quantum efficiencies are then kept high (current efficiency=light emission per current–cd/A–quantum efficiency=emitted photons per injected charge carrier), blocking layers (4a, 6a) are required. The latter prevent formation of excitons (Patent Application No. DE 100 58 578.7). These blocking layers have two important tasks to fulfill:

1. They must prevent the injection of minority charge carriers from the emission zone (5) into the charge carrier transport layers (electrons into 4, holes into 6). The charge carrier transport layers (4, 6) already fulfill this requirement in most cases. The second property of the blocking layers is then important:
2. They must prevent exciplex formation between majority charge carriers in the charge carrier transport layers (holes in 4, and electrons in 6) and charge carriers with a different sign in the emission zone (5) at the interface between the emission layer and the respective charge carrier transport layer. These exciplexes, which recombine nonradiatively and thus reduce the efficiency of the OLED, are formed if the exciplex energy is lower than the energy of an exciton in the emission zone. In this case, the exciplex cannot be converted into an exciton in the emission zone. The cause of this behavior is an excessively high barrier for the majority charge carriers from the transport layers (4 and 6) into the emission zone (5). Said barrier is determined by the HOMO (energy of the highest occupied molecular orbital) difference for hole injection from their transport layer (4) into the emission zone (5) and the LUMO (energy of the lowest unoccupied molecular orbital) difference from 6 into layer/s 5. This process may be prevented by the choice of suitable blocking layers (4a, 6a). The latter have to be adapted with regard to their HOMO/LUMO positions such that they can obstruct minority charge carriers from leaving the emission zone. That is to say that under an applied voltage, the majority charge carriers in the transport layers (4, 6) are not impeded too greatly from injection into the blocking layers (4a, 6a)—medium barrier. At the same time, the minority charge carriers from the emission zone (5) have to be efficiently blocked at the interface with the blocking layers (electrons at 4a, holes at 6a)—high barrier. In addition, the barrier height for majority charge carrier injection from the blocking layers (4a, 6a) into the emission zone layers (5) must be small enough to prevent exciplex formation—low barrier.

In the simplest case, the emission zone (5) comprises only one layer (Tang et al. U.S. Pat. No. 4,356,429, 1982, C. W. Tang et al. Appl. Phys. Lett. 51 (1987) 913). This layer then combines electron and hole transport, exciton formation and decay. These diverse requirements make it difficult to find suitable materials for optimizing the efficiency. By way of example, the standard emitter material Alq3 (aluminum-tris-quinolate, HOMO=−5.7 eV, LUMO=−2.9 eV) is a relatively good electron transporter. It has a large Stokes shift (emission red shifted with respect to the absorption, therefore no reabsorption), but a poor hole conductivity. Therefore, in a component with Alq3 as emitter material the exciton formation takes place near the interface with the hole transport layer (4 or 4a). The selection of this interface is then extremely important for the efficiency of the OLED. This is the reason why the effect of the interface recombination is more important for OLEDs than for inorganic LEDs: since the charge carrier transport in organic layers is often limited to one type of charge carrier and the charge carriers on the organic molecules are localized to a greater extent than in the inorganic case, the recombination zone (where there is a large overlap between the charge carrier densities of both types of charge carrier) is usually near to an internal interface where charge carriers are blocked.

In all organic materials, the photoluminescence quantum efficiency (the proportion of excitons that recombine radio-actively) is limited by so-called "aggregate quenching", the reduced efficiency of the light emission if the molecules are present in closely packed fashion. The photoluminescence quantum efficiency of a pure Alq3 layer is therefore between 10 and 25% (C. W. Tang et al. J. Appl. Phys. 65 (1989) 3610; H. Mattoussi et al. J. Appl. Phys. 86 (1999) 2642), lower than for Alq3 in the solution (>50%).

Therefore, an additional emitter molecule is often admixed with the emission zone (often also referred to as doping in the literature, but should be differentiated from the abovementioned doping for increasing the conductivity) (Tang et al. U.S. Pat. No. 4,769,292, 1988, C. W. Tang et al. J. Appl. Phys. 65 (1989) 3610). This has the advantage that the emitter is no longer present in concentrated fashion and has a higher quantum efficiency of the light emission. Photoluminescence quantum efficiencies of up to 100% are observed (H. Mattoussi et al. J. Appl. Phys. 86 (1999) 2642). The emitter dopants do not participate in the charge carrier transport. The exciton formation on the emitter dopants can take place in two ways:
1. Either directly on the emitter molecule if the latter acts as a charge carrier trap,
2. Or via transfer of energy from the host molecules.

In this way, the current and quantum efficiencies of an OLED can be increased, from e.g. typically 5 cd/A for OLEDs with pure Alq3 as emitter up to 10 cd/A (J. Blochwitz et al. Synth. Met. 127 (2002) 169) with an emitter dopant that emits from singlet exciton states (e.g. a quinacridone or a laser dye, such as coumarin, e.g. coumarin6 HOMO=−5.4 eV, LUMO=−2.7 eV. The concentration is typically 1 mol %. For abovementioned singlet excitons which have a spin of 0 and are formed in the event of bipolar charge carrier injection only to approximately 25%, the transfer of energy takes place via a so-called thirster process. The range of this process approximately corresponds to the doping concentration of 1%.

A further way of increasing the efficiency of the OLEDs is the admixture of molecules that are able to emit triplet states (exciton spin=1) (molecules with strong spin orbit coupling) (Thompson et al. U.S. Pat. No. 6,303,238B1, 1997). These are formed with a probability of approximately 75%. Therefore, theoretically 100% internal efficiency of the OLED is possible for the specific materials that mix singlet and triplet states (T. Tsutsui et at. Jpn. J. Appl. PhysB 38 (1999) L1502; C. Adachi et al. Appl. Phys. Lett. 77 (2000), 904). However, triplet excitons on organic molecules have some disadvantageous compared with singlet excitons:

1. The triplet exciton life time is long, and therefore so is its diffusion length. Therefore, triplet excitons can more easily reach places in the component (such as defects, impurities, contacts) where they recombine nonradiatively. Owing to their long lifetime (typically over 100 times longer than singlet excitons) the exciton density reaches values where exciton-exciton annihilation plays a part. This process limits the efficiency primarily at high current densities (M. A. Baldo et al. Appl. Phys. Lett. 75 (1999) 4, C. Adachi et al. Appl. Phys. Lett. 77 (2000), 904).

2. The energy transfer is slower and has a shorter range (Dexter Process). Therefore, the doping concentrations in the case of admixture of emitter molecules must be approximately 8 mol %. This high density of electrical traps then obstructs current transport and "aggregate quenching" is a more severe problem than in the case of singlet exciton emitters.

3. On account of the long triplet exciton lifetime, the density of triplet excitons at interfaces may assume a high value. Triplet exciton saturation may therefore occur. This "interface exciton saturation process" reduces the formation of further excitons from incoming charge carriers, for which reason the latter can leave the overlap zone. Therefore, the interface zone has only a limited capacity for excitons even though the formation of excitons can take place the most efficiently there. The efficiency of the OLED is therefore reduced.

4. The triplet exciton binding energy is greater than that for singlet excitons (up to 1.5 eV compared with approximately 0.5 eV). Therefore, a transfer of energy is possible from an interface charge carrier pair with spin=1 ("triplet exciplex", one charge carrier on the material of the emission zone (5), the other on the adjoining layer e.g. 4, or 4a for a hole, 6, or 6a for an electron) to a layer exciton on both layers, either on the material of the emission zone (5) or on the material of the respectively adjoining transport layers (4, or 4a, 6 or 6a). The triplet exciton generated on the transport layers will recombine non-radiatively, that is to say reduces the OLED efficiency. In contrast to singlet excitons, this process is possible for triplet excitons even if a high barrier for charge carrier injection (into the layers 4, 4a, 6, 6a) exists.

The significance of blocking layers for the efficiency of triplet OLEDs was shown by Adachi et al. and Ikai et al. (C. Adachi et al. Appl. Phys. Lett. 77 (2000), 904) and M. Ikai et al. (M. Ikai et al. Appl. Phys. Lett. 79 (2001), 156). The former showed that exciton "confinement" of the excitons in the emission zone (as a result of larger band gaps of the surrounding layers) can lead to a very high quantum efficiency even when the emission zone has a small thickness (up to 2.5 nm thin). Without exciton blocking, the efficiency was drastically reduced in the case of such small thicknesses. When the emission layer has a small thickness, however, triplet-triplet annihilation plays a greater part and minimizes the efficiency at high current densities. The second group (Ikai et al.) used a hole transporting host material for the triplet emitter dopant Ir(ppy)3 as guest molecule (Ir(ppy)3-fac-tris(2-phenylpyridine, HOMO= −5.2 . . . −5.6 eV, LUMO=−2.8 . . . −3.0 eV—best known triplet emitter for the green spectral range). Moreover, they used a very efficient exciton and hole blocker (high band gap and low HOMO). That permitted extremely high quantum efficiencies up to almost the theoretical limit of 20% (limit estimated from simple geometrical optics calculations via the coupling-out behavior of the light, wave guiding effects are disregarded).

Internally, then, a 100% quantum efficiency appears to be present, although only for small current densities. The selection of the suitable blocking layer material is crucial for this component. On account of this complexity, it will be difficult to find an equally matching blocking layer material for different emitter systems than Ir(ppy)3 and different host materials than TCTA (tris(N-carbazolyl)triphenylamine, HOMO=−5.9 eV, LUMO=−2.7 eV). The blocking layer material used (a "starburst"-like perfluorinated phenylene) combines an extremely low HOMO position with an extremely large band gap (more than 4 eV). This large band gap also has the disadvantage that electrons can no longer be injected so well from the electron transport layer (LUMO approximately −3 eV) into the blocking layer (LUMO −2.6 eV, barrier 0.4 eV). A stepwise injection of electrons into the light emitting layer (5) would be better for a low operating voltage of the OLED. That has been shown for the hole injection from ITO into the hole transport material (e.g. in MTDATA, a starburst distributor, HOMO=−5.1 eV, LUMO=−1.9 eV via injection layer, e.g. a phthalocyanine ZnPc, HOMO=−5.0 eV, LUMO=−3.4 eV, e.g. D. Ammermann et al. Jpn. J. Appl. Phys. Pt. 1, 34 (1995) 1293). However, for a stepwise electron injection from the electron transport layer (6) into the emitter layer (5) via the blocking layer (6a), the 6a/5 interface becomes more significant because an increased density of electrons and holes can then be recorded there.

One approach for avoiding the problem of triplet emitters at high current densities is the use of sensitized fluorescence, with a phosphorescent sensitizer (M. A. Baldo et al. Nature 403 (2000), 750; B. W. D'Andrade et al. Appl. Phys. Lett. 79 (2001) 1045, Forrest et al. U.S. Pat. No. 6,310,360B1, 1999). In this case, the light emission comes from the fluorescence of the singlet excitons of a suitable singlet emitter dopant. However, the triplet states on the host material are transferred to the singlet emitter dopant via an additional phosphorescent sensitizer dopant (there mixture of triplet and singlet states). In principle, a 100% internal quantum efficiency is also possible with this approach. The advantages of singlet emission can then be utilized at higher current densities. The implementation of this approach has not yet led to outstanding results, probably owing to the complicated interaction of the three molecules involved.

A further approach for increasing the efficiency of triplet OLEDs is known from Hu et al. (W. Hu et al. Appl. Phys. Lett. 77 (2000) 4271). It uses, for a red emitting OLED with a pure layer as emitter layer (5, europium complex Eu(DBM)3TPPO), a hole blocking layer for "exciton confinement", as described above. Owing to the long life-time of the triplet excitons, the annihilation of the latter by free holes is an important process. Therefore, Wu et al. presented an OLED with a multilayer structure of the emission zone (5). The emissions zone comprises a plurality (n times) of small units comprising the emitter itself and the blocking layer material BCP (bathocuproine): {BCP 2.5 nm/Eu (DBM)3TPPO 2.5 nm}$_n$. A doubled efficiency was ascertained, although in conjunction with an increased operating voltage. The interfaces between the two semiconductors in this case are of the type I ("type I heterojunction", see FIG. 2 left). This arrangement arises if HOMO and LUMO levels of the materials A (here the Eu complex HOMO=6.4 eV, LUMO=3.6 eV) and B (here BCP, HOMO=6.7 eV, LUMO=3.2 eV) are arranged such that both charge carrier types are blocked at the interfaces with the material B (both types of charge carrier are thus preferably situated on material A). In the multi-heterojunction component from Hu et al., the hole density is high on the right-hand side of the material A (holes are blocked at the interface between Eu complex and BCP in the direction of the cathode) and the electron density is high on the left-hand side of the material A. Therefore, the overlap of hole and electron density is not optimal since both are separated by the thickness of the layer A. Hu et al. argue that the BCP intermediate layers minimize the hole density in the emission layer. This is not desirable, however, since this increases the operating voltage of the OLED. Moreover, the emitter doping approach ("aggregate quenching") is required for triplet OLEDs in order to achieve high efficiencies. For the latter, the type I multi-heterojunction can no longer be readily realized since this would presuppose the use of a blocking layer material with an extremely high band gap.

In a typical OLED, as illustrated in FIG. 1, the function of the hole blocking layer (6a) is to efficiently obstruct holes from leaving the emitter zone (5). For triplet emitter OLEDs, the emission zone typically comprises a host material with a high band gap (such as CBP—dicarbazole-biphenyl a bipolar transport material, HOMO=−6.3 eV, LUMO=−3.0 eV; BCP, OXD7-bis(butylphenyl)oxadiazole, HOMO=−6.4 eV, LUMO=−2.9 eV, TAZ—phenyl(naphthyl)phenyl-triazole=typical electron transporter, TCTA—tri(carbazolyl)triphenylamine a hole transport material). The band gaps are between 3.2 and 3.5 eV (these materials would emit blue light under photoexcitation). These host materials are mixed with triplet emitter dopants with a smaller band gap (approximately 2.4 eV for green emission e.g. Ir(ppy)$_3$). This large difference between the band gaps of the materials is connected with the nature of the triplet excitons: the exciton binding energy for triplet excitons on organic materials is high. Therefore, a triplet exciton on the host molecule has a lower energy than corresponds to the band gap. In order that an efficient transfer of energy of the triplet exciton from the host to the dopant can still take place, the latter must also have a lower band gap. Therefore, the typical host material for green singlet emitter dopants, Alq3, is actually no longer suitable as host for triplet emitter dopants. Owing to the high band gap of the emission zone host molecules, materials with a high band gap must also be used for the blocking layers. One example of a hole blocking material (from layer 5 to 6a) is BCP or BPhen (BPhen—bathophenanthroline, band gap approximately 3.5 eV, HOMO=−6.4 eV, LUMO=−3.0 eV). The band gap of BPhen is only a little larger than that of a typical host material (e.g. TCTA: 3.4 eV to 3.2 eV), but it must be able to efficiently block holes and so its HOMO must be low. In the case of this arrangement that is typical of triplet emitting OLEDs, the interface between the materials A and B (A=emitting layer material in 5, B=blocking layer material in 6a) forms a so-called staggered type II heterojunction (see FIG. 2, right-hand side). The essential property of this interface is that both types of charge carrier are blocked at the same interface (only on different sides), that is to say holes on their way from the anode to the cathode and electrons on their way from the cathode to the anode. Since the increased density of charge carriers of both types is separated only by a monolayer of molecules, interface recombination is possible. This recombination is efficient with regard to light generation only if it is possible to transfer these interface excitons in excitons on A and later on the triplet dopant in A (e.g. Ir(ppy)3 in TCTA). It must be taken into consideration here that an electron transfer from B to A (which leads to triplet emission from A) is energetically preferred in most cases (even if a high LUMO barrier is present) since the electron transfers to an already positively charged molecule in A. The LUMO level in A does not have to be reached since the energetically stabilized triplet state on A can be reached directly. With the same arguments, it is also possible, of course, to form an exciton on B. However, B is the blocking layer material and therefore unable to recombine radiatively from its triplet state. This reduces the efficiency of the OLED. Owing to the high binding energy of the triplet exciton (up to 1.5 eV), it is thus not readily possible to form, in an OLED, a staggered type II heterojunction, that is able to generate triplet excitons only on the material (A in the previous example) where efficient light generation from triplet states is possible.

Therefore, the object of the present invention is to propose a component structure in which all triplet excitons generated are able to effect light emission, or all charge carriers in the component recombine beforehand to form triplet excitons.

According to the invention, the object is achieved by means of the features mentioned in claims 1 and 2. Subclaims relate to advantageous refinements.

According to the invention, the generation of triplet excitons takes place at at least one internal interface of the type "staggered type II heterojunction" between two materials A (hole transport material or bipolar transport material) and B (electron transport material or bipolar transport material). The energetic arrangement between A and B is such that an interface charge carrier pair with total spin 1 (triplet) comprising a hole on A and an electron on a directly adjacent molecule of type B has an energy that is high enough to enable it to be efficiently converted into triplet excitons either on A and/or on B. Owing to the component structure, all triplet excitons generated on A and/or B can be efficiently transformed into visible light.

Multi-heterojunctions of the type II ("staggered type II") are provided for the emission zone (5). The structure of the emission zone (5) corresponds to the following arrangement: material A-material B-material A-material B . . . ([AB]$_n$), where the following embodiments and properties are possible:

The material A is a hole transport material (and host for triplet emitter dopants), material B is an electron transport material (and host for triplet emitter dopants).

Material A may be a bipolar transport material (and host for triplet emitter dopants) and material B is an electron transport material (and host for triplet emitter dopants).

The material A may be a hole transport material (and host for triplet emitter dopants) and material B is a bipolar transport material (and host for triplet emitter dopants).

It is also within the scope of the invention for only one material A or B to be doped with a triplet emitter dopant. The energetic arrangement of the HOMO and LUMO levels between A and B must be of the type: "staggered type II heterojunction" (FIG. 2, right-hand side, FIG. 3). Holes are thus halted on their way from the anode to the cathode and electrons are halted on their way from the cathode to the anode at each interface AB. The blocking efficiency (principally determined by the barrier height) may differ for electrons and holes. In a special case of the preset invention, one type of charge carriers is not blocked. The interface is also to be regarded as of the type "staggered type II heterojunction" in this case. The number n of interfaces in the emission zone may be 1 or greater than 1 (e.g. n=3 in FIG. 3). If n=1, both materials A and B must be doped with a triplet emitter dopant in order that the construction is within the scope of the present invention. The layer thicknesses of the layers ABABAB . . . need not be identical, rather they should be chosen such that a uniform distribution of the charge carriers in the emission zone is possible and the density of the charge carriers at each internal interface is high. This non-identical distribution is important in particular when one of the materials A and B is a stronger blocker for one of the two types of charge carrier (e.g. holes in the case of the energy level arrangement illustrated in FIG. 3). The corresponding layer thickness (of material B in the example) should then be thin enough to enable enough charge carriers to tunnel through.

In the case where only one of the layers involved is doped with a triplet emitter dopant (as in FIG. 3, only the material A), the other layer serves to keep the density of the electrons and holes at the heterojunction interfaces high. This means that this material must efficiently block holes if it is an electron transport material, or efficiently block electrons if it is a hole transport material. This also means that the undoped material must have a higher band gap than the material doped with the triplet emitter. Moreover, the energy of the triplet excitons in the undoped material must be greater than or equal to the energy of the triplet excitons of the doped material. It is then ensured that, in the case where an exciton has been formed on the undoped material (e.g. B), this can diffuse to the next interface AB, where it can release its energy to a triplet exciton on the doped material (here then A), or an efficient direct transfer of the triplet exciton energy to the triplet emitter dopant (here in A) is possible. Owing to the long lifetime of the triplet excitons on B, this transfer of energy will take place with a probability of almost 100%.

In the case where the exciton density at the internal interfaces AB is so high that the effect of the "interface exciton saturation" becomes dominant, the structure present here equally permits charge carriers that have left the first interface zone AB to be able to recombine to form triplet excitons at the next interface AB.

The construction of the emission zone (5) made from a plurality of interfaces of the type "staggered type II heterojunction" permits the following, in parallel:

That all holes and electrons can recombine without reaching the opposite contact, That all holes and electrons recombine near an active interface in the emission zone, That all excitons cannot leave the emission zone, and That all excitons are generated in regions of the emission zone where they are able to transfer their energy to the triplet emitter dopants situated in the entire emission zone or parts of the emission zone.

The present invention makes it possible to avoid all of the above-mentioned problems of conventional triplet OLEDs and to obtain the highest possible efficiency of such an OLED without further restrictions in the selection of the materials that are required in order to optimize further properties (such as low operating voltage).

In order to describe the preset invention using exemplary embodiments, in the following figures:

FIG. 1 shows a schematic energy diagram of a known OLED structure described in the introduction, without an applied voltage, band bending or interface effect influences on the energy levels FIG. 2 shows, on the left: a schematic energy diagram between material A and B with an energy level arrangement corresponding to a "type I heterojunction" on the right: the same for a "staggered type II heterojunction" arrangement of the interface between A and B; in this example, the hole blocking effect is shown as being greater (higher barrier)

A preferred embodiment of the present invention will now be presented. The general case of the multi-heterojunction within the emission zone (5) is shown.

The OLED with emission from the triplet excitons comprises the following layers:

EXAMPLE 1

1. Substrate,
2. Bottom electrode, e.g. hole injection (anode),
3. Hole injection layer,
4. Hole transport layer (HTL),
4a. Possibly blocking layer, hole side,
    Light emission zone=multi-heterojunction (n=3)
    5A1d. Hole transport material (or bipolar transport material), doped with emitter dopant,
    5B1d or 5B1u. Electron transport layer (or bipolar transport layer), possibly doped with emitter dopant,
    5A2d. Hole transport material (or bipolar transport material) doped with emitter dopant,
    5B2d or 5B2u. Electron transport layer (or bipolar transport layer), possibly doped with emitter dopant,
    5A3d. Hole transport material (or bipolar transport material), doped with emitter dopant,
    5B3d or 5B3u. Electron transport layer (or bipolar transport layer), possibly doped with emitter dopant,
6. Electron transport layer (ETL),
7. Electron injection layer,
8. Top electrode (cathode),
9. Encapsulation, where the interface ABAB . . . is of the type "staggered type II heterojunction".

Figure 1:
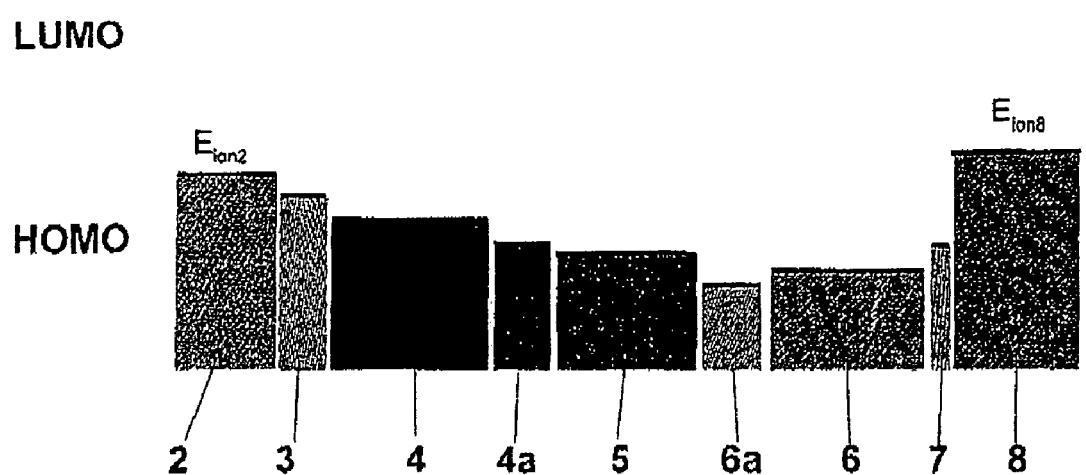
Figure 2:
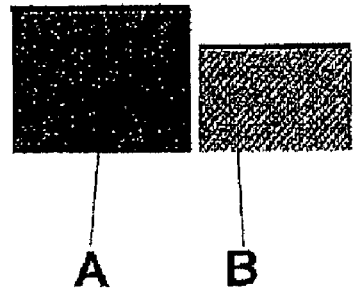
Figure 2:
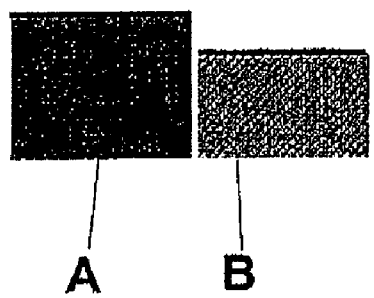
Figure 3:
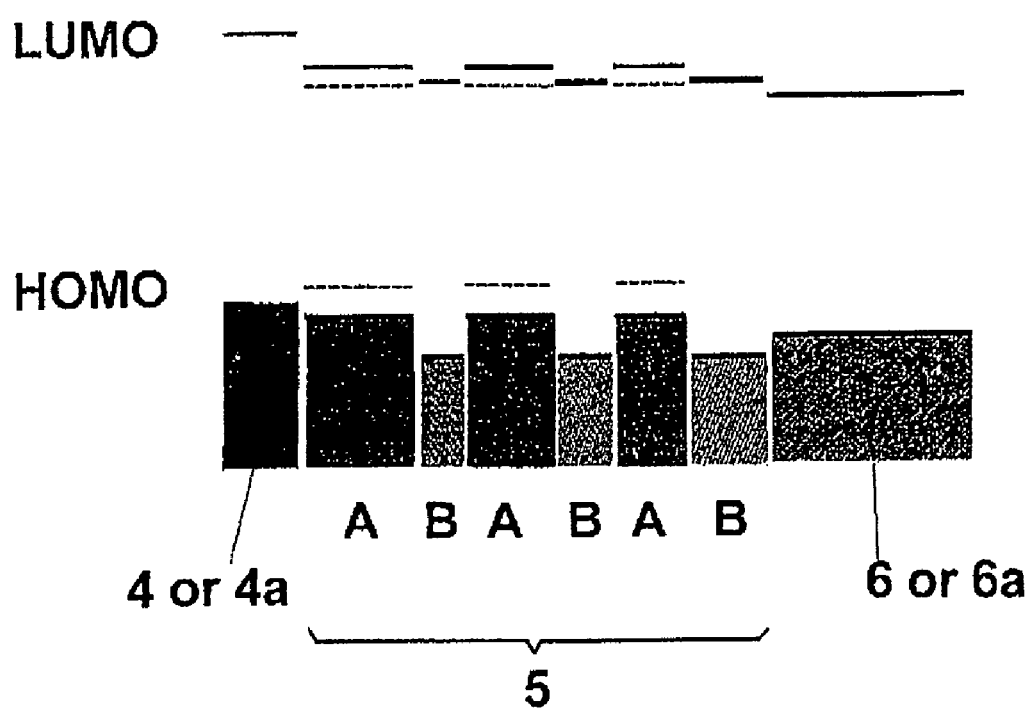
FIG. 3 shows a schematic energy diagram of a multi-heterojunction structure of the type "staggered type II heterojunction" where n=3 (ABABAB); here only material A is doped with a triplet emitter dopant; for completeness, the energy positions of the surrounding layers are equally illustrated (4 or 4a, 6 or 6a)
Figure 4:
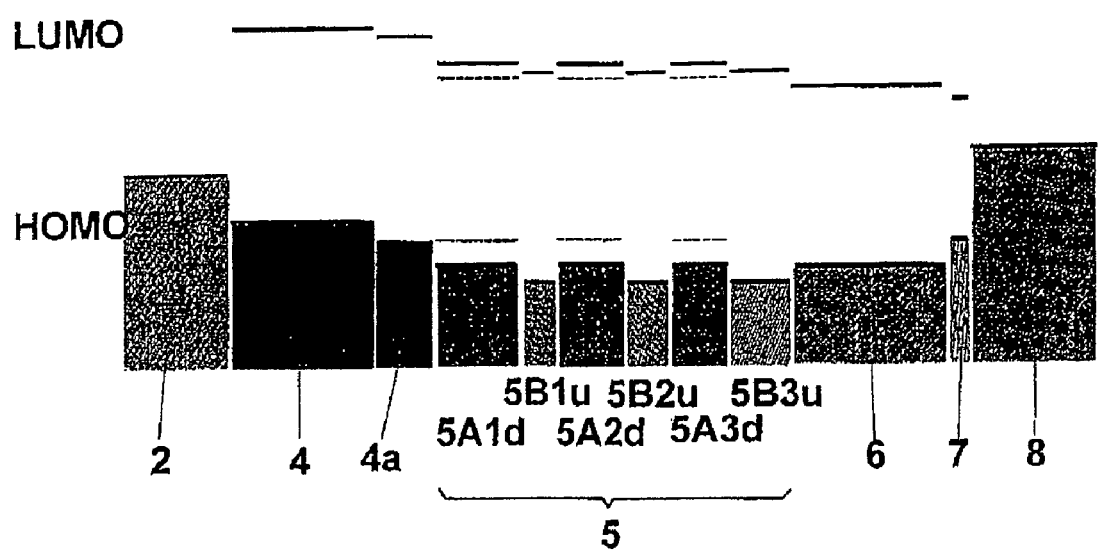
FIG. 4 shows a schematic situation in an arrangement as described in EXAMPLE 2 (below), ABABAB structure

A typical realization of the embodiment just described is the following material sequence (cf. FIG. 4). These materials are examples which are intended to demonstrate a layer sequence in accordance with the present invention:

EXAMPLE 2

1°. Glass substrate,
2. ITO anode,
4. Starburst (MTDATA) doped with F4-TCNQ 100 nm (increase in conductivity),
4a. TPD (triphenyldiamine) 5 nm, HOMO=−5.4 eV, LUMO=−2.4 eV,
    Light emission zone=multi-heterojunction (n=3)
    5A1d. TCTA doped with Ir(ppy)3 as triplet emitter 10 nm, 5B1u. BPhen 5 nm
5A2d. TCTA: Ir(ppy)3 15 nm,
5B2u. BPhen 5 nm
5A3d. TCTA: Ir(ppy)3 2 nm,
5B3u. BPhen 10 nm
6. Alq3 40 nm,
7. LiF(lithiumfluoride) 1 nm,
8. Aluminum (cathode).

In this case, the interface AB is embodied such that holes are blocked more efficiently at the interface AB. This is necessary since only material A is doped with the emitter dopant, and therefore the higher charge carrier density should be in the material A. Even more important, however, is the fact that the triplet excitons in B have a greater energy than those in A. Therefore, the excitons generated on B can be converted later into excitons on A (or the emitter dopant in A).

It is evident from the energy level arrangement in FIG. 4 that

Excitons which are generated in the inner triplet emitter doped layer TCTA (5A2, the same arguments also hold true for the layers 5A1 and 5A3) cannot leave the latter because the triplet state on BPhen has a higher energy.

Excitons which are generated in the layers 5B1 and 5B2 can diffuse in both directions to an interface with TCTA: Ir(ppy)3, where they can be converted into triplet excitons on TCTA or on Ir(ppy)3 (lower energy of these triplet excitons). The latter recombine with light emission.

Holes which pass through the emission zone can later recombine at the interface between 5A3 and 5B3 to form triplet excitons, principally to form those on 5A3 (here TCTA: Ir(ppy)3).

Electrons which pass through the emission zone can later recombine at the interface between 5A1 and 4A with holes at said interface (the latter are weakly blocked at the interface 4a with 5A1). There they can form excitons on TCTA or IR(ppy)3 (in 5A1).

The thicknesses of the various layers are chosen so as to achieve a good balance between holes and electrons within the emission zone (balance between blocking effects and charge carrier transport). Therefore, the thickness of the last TCTA: Ir(ppy)3 layer (5A3) is smaller than that of the layers 5A1 and 5A2. This permits a good electron injection into the other emitter doped layers (5A1 and 5A2) because TCTA has a relatively low barrier for electron injection but a low electron mobility. However, the thickness of the layer 5A3 is large enough that the remaining holes which reach said layer can recombine with the electrons present there. All injected holes and electrons will recombine within the emission zone and later decay radiatively because all excitons formed are able to reach a part of the emission zone in which they can decay by way of triplet emitter dopants. The OLED would function equally well if the blocking layer and electron transport material (BPhen) within the emission zone were equally doped with the same or a different triplet emitter dopant.

Figure 5:
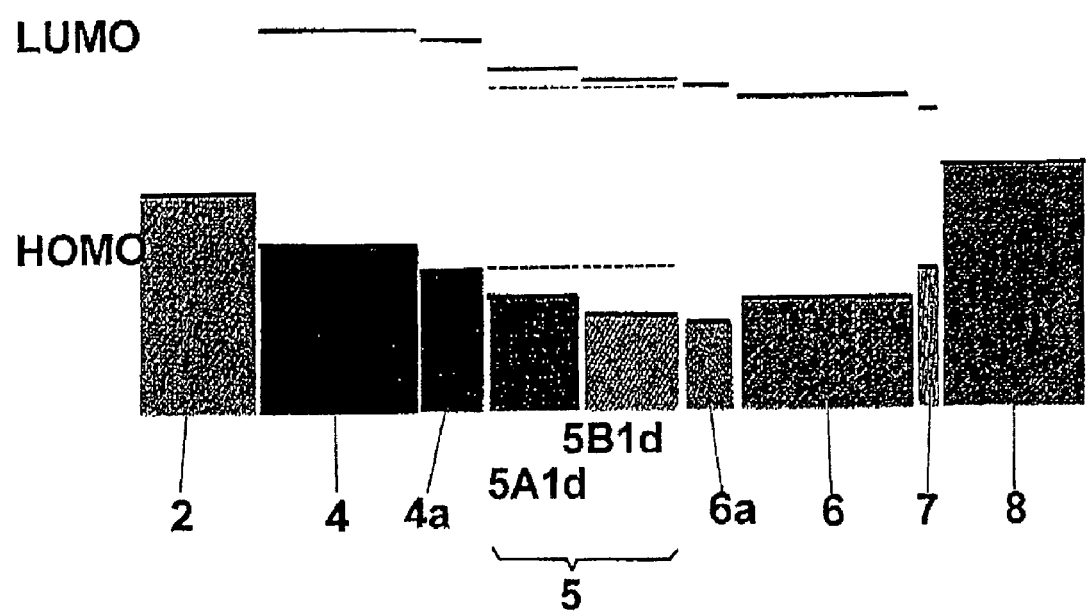
FIG. 5 shows a schematic situation in an arrangement as described in EXAMPLE 3 (below) AB structure (A and B are doped)

The number of heterojunctions, which was n=3 in the two previous examples, may be higher or lower. In the case of n=1, both materials A and B of the heterojunction must be doped with a triplet emitter dopant in order to obtain a structure in accordance with the present invention. A preferred exemplary embodiment with exemplary materials is (cf. FIG. 5):

EXAMPLE 3

1. Substrate,
2. Bottom electrode, e.g. ITO anode,
3. Hole injection layer, e.g. a phthalocyanin,
4. Hole transport layer, e.g. MTDATA:F4-TCNQ,
4a. Blocking layer on the hole side, e.g. TPD
   Light emission zone=multi-heterojunction (n=1)
5A1d. Hole transport layer, doped with emitter dopant, e.g. TCTA:Ir(ppy)3,
5B1d. Electron transport layer and hole blocking layer, doped with emitter dopant, e.g. Bphen:Ir(ppy)3,
6a. Blocking layer on electron side, e.g. BCP,
6. Electron transport layer, e.g. Alq3,
7. Electron injection layer e.g. LiF,
8. Top electrode (cathode) e.g. aluminum.

Exciton formation in this OLED structure again takes place near the interface 5A1 and 5B1 (because the latter forms a "staggered type II heterojunction". Interface excitons can transfer their energy either to a triplet exciton in the layer 5A1 or 5B1. Both layers are doped with a triplet emitter dopant. They can diffuse there, but are halted at the interfaces with 4a and 6a and therefore decay radiatively in the doped layers. The use of hole transport materials and electron transport materials, both doped with a triplet emitter, permits all excitons to be able to recombine radiatively.

Figure 6:
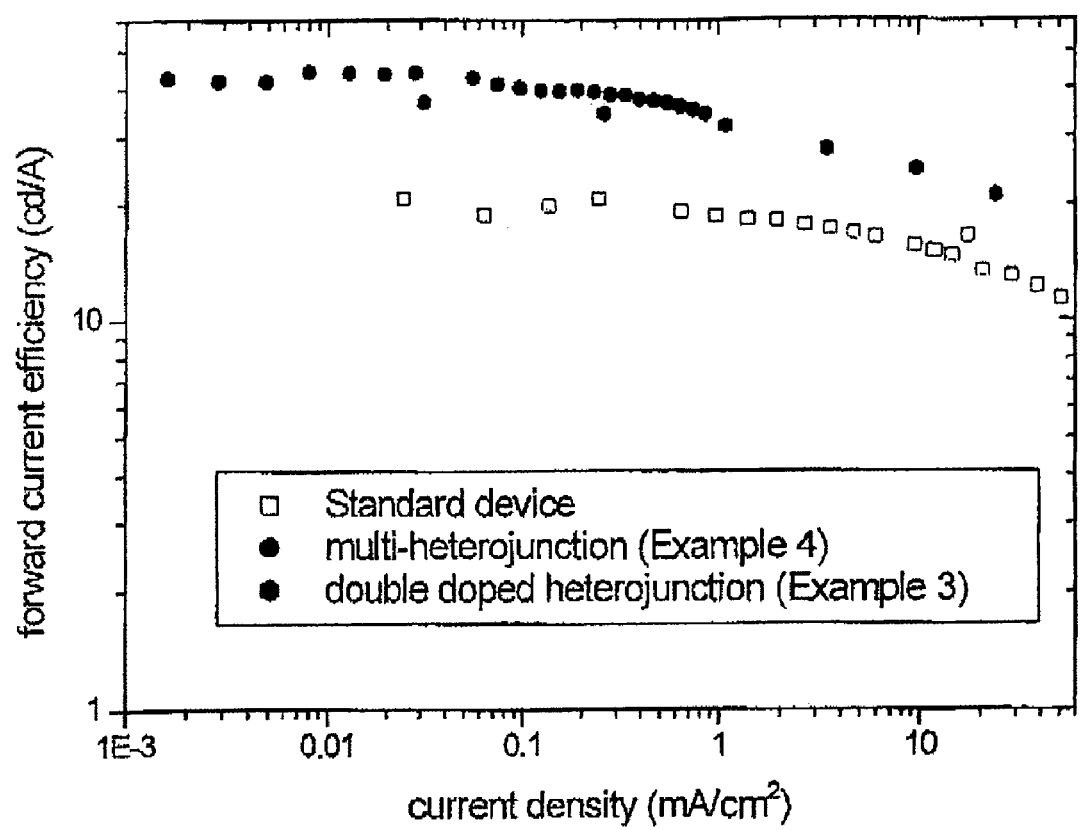
FIG. 6 shows current efficiency vs. current density characteristic curves for a STANDARD OLED, an OLED as in EXAMPLE 4 (n=2) and an OLED as in EXAMPLE 3 (n=1 with doped hole transport layer and doped electron transport layer).

FIG. 6 shows the current efficiency/current density characteristic curve of a sample in accordance with exemplary embodiment EXAMPLE 3. The exact OLED structure is: ITO/100 nm p-doped MTDATA (4)/10 nm Ir(ppy)3 doped TCTA (5A1d)/10 nm Ir(ppy)3 doped Bphen (5B1d)/40 nm BPhen (6)/1 m LiF (7)/Al (8). In this embodiment, the layer (4) combines hole transport and blocking layer properties.

A further exemplary embodiment with exemplary materials is presented below and the optoelectronic properties thereof are compared with a standard sample (without a heterojunction in the emission zone):

EXAMPLE 4

1. Substrate,
2. ITO anode,
4. MTDATA:F4-TCNQ 100 nm,
   Light emission zone=multi-heterojunction (n=2)
5A1d. TCTA Ir(ppy)3 20 nm,
5B1u. BPhen 10 nm
5A2d. TCTA: Ir(ppy)3 1.5 nm,
5B2u. BPhen 20 nm,
6. Alq3 30 nm,
7. LiF 1 nm,
8. Aluminum.

The blocking layers have been omitted in this structure because (i) MTDATA already efficiently blocks electrons, and (ii) the last layer of the multi-heterojunction (5B2) equally already functions as a blocking layer for holes.

The standard structure comprises:
Standard Structure:
2: ITO
4: MTDATA:F4TCNQ 100 nm
5: TCTA:Irppy 20 nm
6a: BPhen 20 nm
6: Alq3 30 nm
7: LiF 1 nm
8: Al.

In FIG. 6, the efficiency of these two OLEDs is compared (as a function of the current density). The efficiency without a multi-heterojunction is at most 20 cd/A, and the efficiency with a multi-heterojunction (n=2) is more than 40 cd/A. The OLED efficiency was able to be increased by a factor of 2 without using other materials in the OLED. FIG. 6 additionally shows the efficiency curve of the OLED form EXAMPLE 3. This also shows a doubling of the efficiency.

The increase in the current efficiency cannot be attributed to micro cavity effects because the absolute layer thickness of the samples are approximately identical and the refractive indices of the organic layers differ only marginally. Thus, a luminance increase in the forward direction cannot be expected.

Heterojunctions in the emission zone of OLEDs are known from OLEDs with emission of singlet exciton states. In contrast to the present invention, these usually use undoped layers in so-called multiple quantum well structures (Y. Ohmori et al. Appl. Phys. Lett. 62 (1993), 3250; Y. Ohmori et al. Appl. Phys. Lett. 63 (1993), 1871). These quantum well structures (sometimes also called superlattices or multilayer structure) are designed such that the emission spectrum of the OLED can be influenced. It has been found, however, that such structures (e.g. Alq3 alternating with TPD; this interface is also one of the type II) do not lead to a significant increase in the efficiency of the OLED. Mori et al. (T. Mori et al. J. Phys. D-Appl. Phys. 32 (1999), 1198) have investigated the effect of a stacked structure, on OLEDs with singlet emitter dopants in the emission zone and even ascertained a reduction of the efficiency of the OLED. Therefore, it should be noted that the multilayer emission zone type II works differently in the case of singlet emission than in the case of triplet emission described above. This is connected, as explained, with the longer triplet exciton lifetime and the increased exciton binding energy. The reason for this is the possibility, for singlet excitons, of relatively easily constructing an interface of the type II at which excitons are only formed on one side of the interface, namely preferably the side with the higher yield of radiative recombination of the singlet exciton states. Owing to the higher binding energy of the triplet excitons, however, these triplet excitons are formed on both materials of the interface. The advantage of components based on the structure proposed in this patent is that it can efficiently "collect" holes and electrons and convert them into light.

A paper by Huang et al. (J. S. Huang Jpn. J. Appl. Phys. 40 (2001) 6630) presented a multiple quantum well structure which, with spiro-TAD (a stable version of the material TPD) and Alq3 (that is to say type II interfaces) constructs an emission zone (5) in a standard construction. No appreciable increase in the efficiency was found in that case either (from 4 to 4.5 cd/A at an operating voltage of 4.5 V). On the other hand, Huang et al. (J. S. Huang et al. Appl. Phys. Lett. 73 (1998) 3348) found an appreciable rise in the efficiency for a multilayer structure with Alq3 and rubrene (an orange singlet emitter die) doped in Alq3 in the emission zone (5). This structure forms type I heterojunctions where only the excitons in the rubrene doped layers are collected, and is thus not in accordance with this patent. A further approach in singlet emitter OLEDs is that of Sakamoto et al. (G. Sakamoto et al. Appl. Phys. Lett. 75 (1999) 766). He presented an OLED structure having the layer sequence: anode/hole injection layer/hole transport layer doped with rubrene/electron transport layer and emitter layer (Alq3) doped with rubrene/cathode. The efficiency of this component could only be increased a little compared with the component in which only the emission layer was doped with rubrene. The principal effect was an increase in the lifetime of the OLED. The higher stability is caused by the reduction of the density of free holes in the emission layer Alq3, which leads to a reduced irreversible oxidation of Alq3. The small rise in the efficiency in the double doped OLED can be attributed to an improved balance of holes and electrons in the emission layer.

The examples explained above describe the concept presented here. The specialist in the field may propose many further exemplary embodiments in accordance with the present invention which cannot all be discussed in detail here. For example, it is clear that the component structure ABAB . . . may also be of the type ABCD . . . if material C has similar properties to material A (hole transport or bipolar transport) and material D has similar properties to material B (electron transport or bipolar transport) and the interfaces are of the type II.

LIST OF REFERENCE SYMBOLS

1 Substrate
2 Anode or cathode
3 Hole injection layer (possibly doped in order to increase the conductivity)
4 Hole transport layer (possibly doped in order to increase the conductivity)
4a Blocking layer on the hole side
5 Light emitting layer, may comprise various layers:
  5A1d, 5A2d, 5A3d Multi-heterojunction material of type A (hole transport), doped with emitter dopant
  5B1d, 5B2d, 5B3d Multi-heterojunction material of type B (electron transport and hole blocker), doped with emitter dopant
  5B1u, 5B2u, 5B3u Multi-heterojunction material of type B (electron transport and hole blocker), not doped with emitter dopant
6a Blocking layer on electron side
6 Electron transport layer (possibly doped in order to increase the conductivity)
7 Electron injection layer (possibly doped in order to increase the conductivity)
8 Cathode
9 Encapsulation
A First part of the heterojunction
B Second part of the heterojunction

What is claimed is:

1. A light emitting component comprising organic layers and emission of triplet exciton states (phosphorescent light) with increased efficiency, having a layer sequence with a hole injecting contact (anode), one or more hole injecting and transporting layers, a system of layers in the light emission zone, one or more electron transport and injection layers and an electron injecting contact (cathode), characterized in that the light emitting zone comprises a series of heterojunctions with the materials A and B (ABAB . . . ) that form interfaces of the type "staggered type II", one material (A), having hole transporting or bipolar transport properties and the other material (B) having electron transporting or bipolar transport properties, and at least one of the two materials A or B being mixed with a triplet emitter dopant that is able to efficiently convert its triplet exciton energy into light.

2. A light emitting component comprising organic layers and emission of triplet exciton states (phosphorescent light) with increased efficiency, having a layer sequence with a hole injecting contact (anode), one or more hole injecting and transporting layers, a system of layers in the light emission zone, one or more electron transport and injection layers and an electron injecting contact (cathode), characterized in that the light emitting zone comprises a heterojunction with the materials A and B (AB), the interface being of the type "staggered type II", material (A) having hole transporting or bipolar transport properties and the other material (B) having electron transporting or bipolar transport properties, and both materials A or B being mixed with a triplet emitter dopant that is able to efficiently convert its triplet exciton energy into light.

3. The light emitting component as in claim 1, characterized in that both materials of the multi-heterostructure in the light emission zone are mixed in doped fashion with the same triplet emitter dopant.

4. The light emitting component as in claim 1, characterized in that material A of the multi-hetero structure is mixed with one triplet emitter dopant and material B is mixed with another triplet emitter dopant.

5. The light emitting component as in claim 1, characterized in that material A (or material B) is mixed with a triplet emitter dopant and material B (or A) is not mixed with such a dopant, the energy of the lowest triplet state on B (or A) being at least as great as that of the triplet state on material A (or B), so that an efficient transfer of energy of the triplet excitons on B to those on A can take place.

6. The light emitting component as in claim 1, characterized in that material A (or material B) is mixed with a triplet emitter dopant and material B (or A) is mixed with an emitter dopant that is able to efficiently emit light from singlet states, the energy of the lowest triplet state on B (or A) being at least as great as that of the triplet state on material A (or B), so that an efficient transfer of energy of the triplet excitons on B to those on A can take place.

7. The light emitting component as in claim 1, characterized in that the heterojunction occurs in the light emission zone between two times (A1, B1, A2, B2) and ten times ($[AB]_{10}$).

8. The light emitting component as in claim 1, characterized in that the interfaces between A and B are able to block holes at the interface from A to B and electrons at the interface from B to A (definition of the "staggered type II heterojunction").

9. The light emitting component as in claim 1, characterized in that the interfaces between A and B are able to block holes (or electrons) at the interface from A to B (or from B to A) and to only weakly impede electrons (or holes) at the interface from B to A (or from A to B) (barrier for charge carrier injection<0.2 eV), and the material B (or A) has a larger band gap than material A (or B).

10. The light emitting component as in claim 1, characterized in that the materials A and B and the emitter dopants are chosen such that an efficient transfer of energy from singlet and triplet excitons on A and B to the emitter dopants is possible.

11. The light emitting component as in claim 1, characterized in that the thicknesses of the individual layers (A1, B1, A2, B2, . . . ) within the emission zone is chosen so as to achieve a maximum efficiency and lowest operating voltage of the OLED.

12. The light emitting component as in claim 1, characterized in that the OLED contains a blocking layer between the innermost hole transport layer and the first light emission layer (A1), there existing a barrier for electron injection from A1 into the hole transport layers.

13. The light emitting component as in claim 1, characterized in that the layer sequence of the OLED furthermore contains a blocking layer between the innermost electron transport layer and the last light emission layer (Bn), there existing a barrier for hole injection from the light emission layer into the electron transport layer.

14. A light emitting component as in claim 1, characterized in that the structure of the type ABAB . . . may also be of the type ABCD, material C having similar properties to material A (hole transport or bipolar transport), and material D having similar properties to material B (electron transport or bipolar transport), and interfaces of the type "staggered type II" arising between the materials.

15. The light emitting component as in claim 1, characterized in that the layer thicknesses of the organic layers lie in the range of 0.1 nm to 50 μm.

16. The light emitting component as in claim 1, characterized in that the layers comprise small molecules that are vapor deposited in vacuo, or completely or partly comprise polymers.

17. The light emitting component as in claim 1, characterized in that the mixed layers are produced by mixing vaporization in vacuo, or by application of a mixed layer from a solution or by successive application of the materials with subsequent diffusion of the dopants into the layers.

* * * * *